(12) United States Patent
Chen et al.

(10) Patent No.: US 12,341,007 B2
(45) Date of Patent: Jun. 24, 2025

(54) METHOD OF PATTERNING UNDERLYING STRUCTURE

(71) Applicant: Powerchip Semiconductor Manufacturing Corporation, Hsinchu (TW)

(72) Inventors: Yun-An Chen, New Taipei (TW); Hsiao-Shan Huang, Taichung (TW); Hsiao-Chiang Lin, New Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 425 days.

(21) Appl. No.: 18/155,723

(22) Filed: Jan. 17, 2023

(65) Prior Publication Data

US 2024/0145244 A1    May 2, 2024

(30) Foreign Application Priority Data

Oct. 31, 2022  (TW) .................................. 111141296

(51) Int. Cl.
| | | |
|---|---|---|
| H01L 21/027 | (2006.01) | |
| H01L 21/033 | (2006.01) | |
| H01L 21/308 | (2006.01) | |
| H01L 21/311 | (2006.01) | |
| H01L 21/768 | (2006.01) | |

(52) U.S. Cl.
CPC ...... *H01L 21/0274* (2013.01); *H01L 21/0337* (2013.01); *H01L 21/3086* (2013.01); *H01L 21/31105* (2013.01); *H01L 21/31127* (2013.01); *H01L 21/31144* (2013.01); *H01L 21/76804* (2013.01); *H01L 21/76807* (2013.01); *H01L 21/76816* (2013.01)

(58) Field of Classification Search
None
See application file for complete search history.

(56) References Cited

U.S. PATENT DOCUMENTS

| | | |
|---|---|---|
| 5,552,346 A | 9/1996 | Huang et al. |
| 6,645,851 B1 | 11/2003 | Ho et al. |
| 9,412,753 B2 | 8/2016 | Izumi et al. |
| 2004/0077170 A1 | 4/2004 | Hattori |
| 2011/0089526 A1 | 4/2011 | Lee et al. |
| 2015/0331309 A1 | 11/2015 | Hsueh et al. |

FOREIGN PATENT DOCUMENTS

| | | |
|---|---|---|
| CN | 107703722 | 12/2020 |
| TW | 550766 | 9/2016 |

OTHER PUBLICATIONS

"Office Action of Taiwan Counterpart Application", issued on Apr. 20, 2023, p. 1-p. 4.

*Primary Examiner* — Anthony Ho
(74) *Attorney, Agent, or Firm* — JCIPRNET (57) ABSTRACT

A method of patterning an underlying structure includes the following. A first patterning process is performed on the underlying structure to form a first patterned underlying structure including a first opening. A patterned photoresist layer is formed, and the patterned photoresist layer fills the first opening. A second patterning process is performed on the first patterned underlying structure to form a second patterned underlying structure including the first opening and a second opening.

13 Claims, 7 Drawing Sheets

METHOD OF PATTERNING UNDERLYING STRUCTURE

CROSS-REFERENCE TO RELATED APPLICATION

This application claims the priority benefit of Taiwan application serial no. 111141296, filed on Oct. 31, 2022. The entirety of the above-mentioned patent application is hereby incorporated by reference herein and made a part of this specification.

BACKGROUND

Technical Field

The disclosure relates to a method of patterning an underlying structure.

Description of Related Art

In the existing semiconductors fabricating process, a patterning process is usually performed on an insulating layer, a semiconductor layer or a metal layer by a photolithography process. In general, a photoresist material is applied to an underlying structure that needs to be patterned. Next, the photoresist material is patterned through an exposure process and a developing process, and finally an etching process is performed on the underlying structure using the patterned photoresist layer as a mask to obtain a patterned underlying structure.

With the advancement of technology, the critical dimension of the photolithography process is gradually shrinking. If a slight deviation of the photoresist material occurs during the exposure process or the developing process, it may cause a failure of a fabricated semiconductor device. Therefore, at present, many manufacturers are devoting themselves to reducing the probability of the deviation of the photoresist material during the exposure process or the developing process.

SUMMARY

The disclosure provides a method of patterning an underlying structure, which improves the yield of an opening in a patterned underlying structure and reduces the cost of a patterning process.

At least an embodiment of the disclosure provides a method of patterning an underlying structure, including the following. The underlying structure is provided. A first photoresist material is formed on the underlying structure. The first photoresist material is patterned using a first photomask as a mask to form a first patterned photoresist layer. A first patterning process is performed on the underlying structure to form a first patterned underlying structure including a first opening. The first patterning process includes etching the underlying structure using the first patterned photoresist layer as a mask. A second photoresist material is formed on the first patterned underlying structure, and the second photoresist material fills the first opening. The second photoresist material is patterned using the first photomask as a mask to form a second patterned photoresist layer, and the second patterned photoresist layer fills the first opening. A third photoresist material is formed on the first patterned underlying structure and the second patterned photoresist layer. The third photoresist material is patterned using a second photomask as a mask to form a third patterned photoresist layer. A second patterning process is performed on the first patterned underlying structure to form a second patterned underlying structure including the first opening and a second opening. The second patterning process includes etching the first patterned underlying structure using the third patterned photoresist layer as a mask.

Based on the above, since the second patterned photoresist layer fills the first opening, influence of the first opening on the third photoresist material is reduced, so as to improve the yield of the second opening. In addition, since the first photoresist material and the second photoresist material are patterned using the same first photomask, the cost required for a photomask is saved.

DESCRIPTION OF THE EMBODIMENTS

Figure 1A:
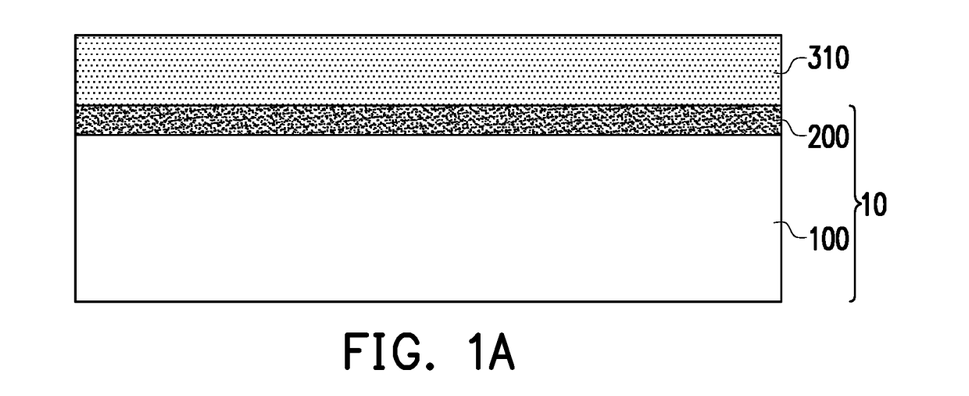
FIGS. 1A to 1J are schematic cross-sectional views of a method of patterning an underlying structure according to an embodiment of the disclosure.

FIGS. 1A to 1J are schematic cross-sectional views of a method of patterning an underlying structure according to an embodiment of the disclosure. Referring to FIG. 1A, an underlying structure 10 is provided. In this embodiment, the underlying structure 10 includes a semiconductor structure 100 and a hard mask layer 200.

The semiconductor structure 100 includes a semiconductor substrate. A material of the semiconductor substrate is, for example, a silicon substrate, a silicon carbide substrate, a gallium nitride substrate or other suitable semiconductor materials. In some embodiments, the semiconductor structure 100 further includes a conductive layer (not shown) or an insulating layer (not shown) on the semiconductor substrate, but the disclosure is not limited thereto.

The hard mask layer 200 is located on the semiconductor structure 100. In some embodiments, a material of the hard mask layer 200 includes a material having a different etch rate from the semiconductor structure 100, for example, silicon oxide, silicon nitride, silicon oxynitride or other materials. In this embodiment, the underlying structure 10 includes the hard mask layer 200, but the disclosure is not limited thereto. In other embodiments, the underlying structure 10 does not include the hard mask layer 200. In other words, in other embodiments, a photoresist material is directly formed on the semiconductor structure 100.

A first photoresist material 310 is formed on the underlying structure 10. In this embodiment, the first photoresist material 310 is directly formed on the hard mask layer 200. A method of forming the first photoresist material 310 includes spin coating or other suitable processes.

Figure 1B:
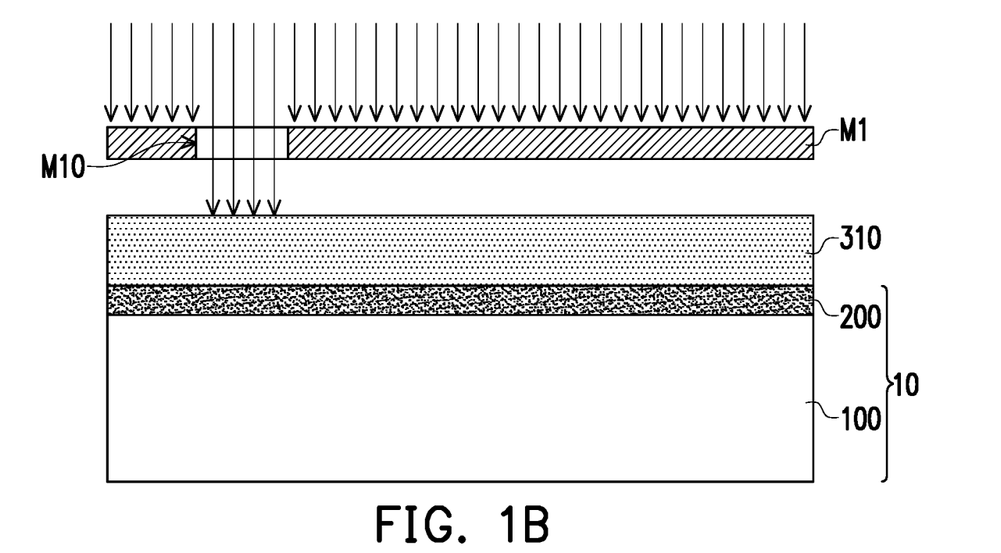
Figure 1C:
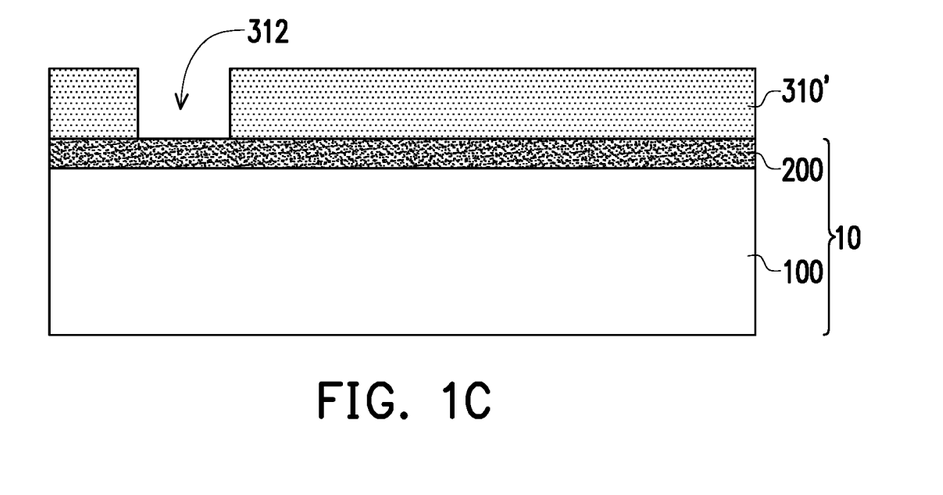

Referring to FIGS. 1B to 1C, the first photoresist material 310 is patterned using a first photomask M1 as a mask to form a first patterned photoresist layer 310' including a through hole 312. In this embodiment, the first photoresist material 310 is a positive photoresist, and a part where the first photoresist material 310 is exposed by an opening M10 of the first photomask M1 is removed by a developer during a developing process, but the disclosure is not limited thereto.

Figure 1D:
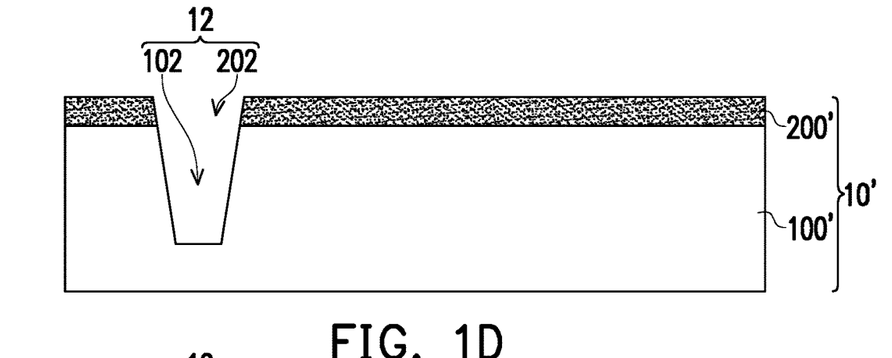

Referring to FIGS. 1C to 1D, a first patterning process is performed on the underlying structure 10 to form a first patterned underlying structure 10' including a first opening 12. The first patterning process includes etching the underlying structure 10 using the first patterned photoresist layer 310' as a mask.

In this embodiment, the first patterned underlying structure 10' includes a first patterned hard mask layer 200' and a first patterned semiconductor structure 100', and the first opening 12 extends from the first patterned hard mask layer 200' into the first patterned semiconductor structure 100'. For example, the first patterning process includes the following steps. The hard mask layer 200 is etched using the first patterned photoresist layer 310' as a mask to form the first patterned hard mask layer 200' including an opening 202. Next, the semiconductor structure 100 is etched using the first patterned hard mask layer 200' as a mask to form the first patterned semiconductor structure 100' including an opening 102. The first opening 12 is composed of the opening 202 and the opening 102.

In some embodiments, the first patterned photoresist layer 310' is removed while the underlying structure 10 is etched (e.g., while the hard mask layer 200 is etched or the semiconductor structure 100 is etched), but the disclosure is not limited thereto. In other embodiments, an additional removal process is provided to remove the unnecessary first patterned photoresist layer 310'. The removal process includes, for example, an ashing process or other suitable process.

Figure 1E:
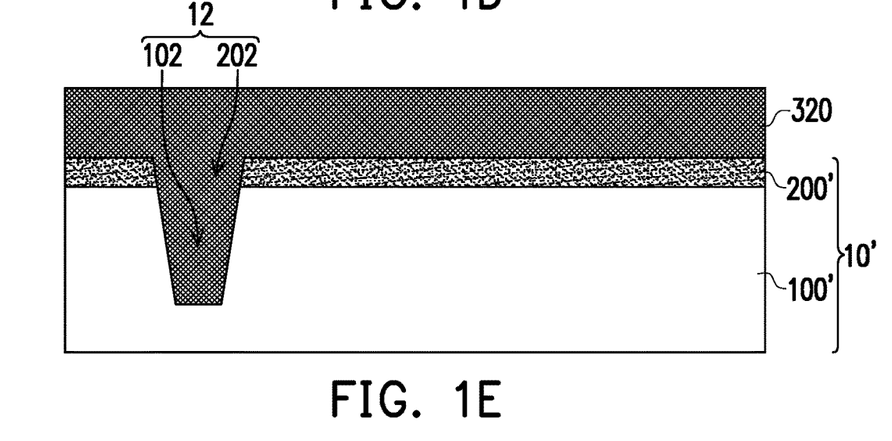

Referring to FIG. 1E, a second photoresist material 320 is formed on the first patterned underlying structure 10', and the second photoresist material 320 fills the first opening 12. In this embodiment, the second photoresist material 320 is directly formed on the first patterned hard mask layer 200' and the first patterned semiconductor structure 100'. A method of forming the second photoresist material 320 includes spin coating or other suitable processes.

Figure 1F:
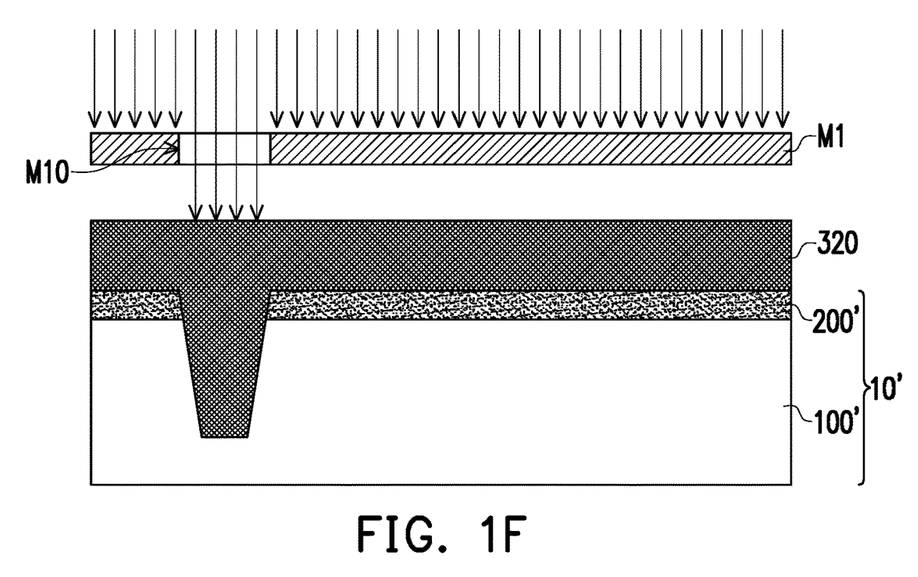
Figure 1G:
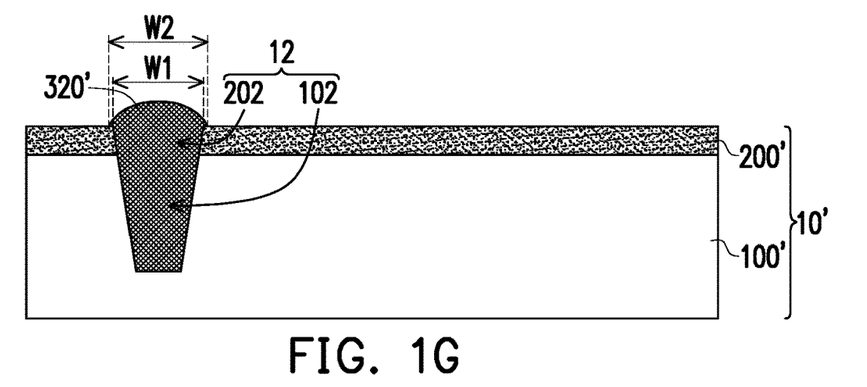

Referring to FIGS. 1F and 1G, the second photoresist material 320 is patterned using the first photomask M1 as a mask again to form a second patterned photoresist layer 320'. The second patterned photoresist layer 320' fills the first opening 12. In this embodiment, one of the first photoresist material 310 (referring to FIG. 1A) and the second photoresist material 320 is a positive photoresist material, and the other is a negative photoresist material. For example, in this embodiment, the first photoresist material 310 is a positive photoresist, and the second photoresist material 320 is a negative photoresist. A part where the second photoresist material 320 is shielded by the first photomask M1 is removed by a developer during a developing process.

In other embodiments, the first photoresist material 310 is a negative photoresist, and the second photoresist material 320 is a positive photoresist. In the aforementioned case, a part where the first photoresist material 310 is shielded by the first photomask M1 is removed by a developer during a developing process, and a part where the second photoresist material 320 is exposed by the opening M10 of the first photomask M1 is removed by a developer during a developing process.

In some embodiments, a top surface of the second patterned photoresist layer 320' extends beyond the first opening 12. In some embodiments, the second patterned photoresist layer 320' completely fills the first opening 12. In some embodiments, a width W2 of the second patterned photoresist layer 320' is different from a width W1 of the first opening 12. For example, the width W2 is greater than the width W1.

In this embodiment, since the first photoresist material 310 (referring to FIG. 1B) and the second photoresist material 320 are patterned using the same first photomask M1, the cost required for a photolithography process may be saved.

Figure 1H:
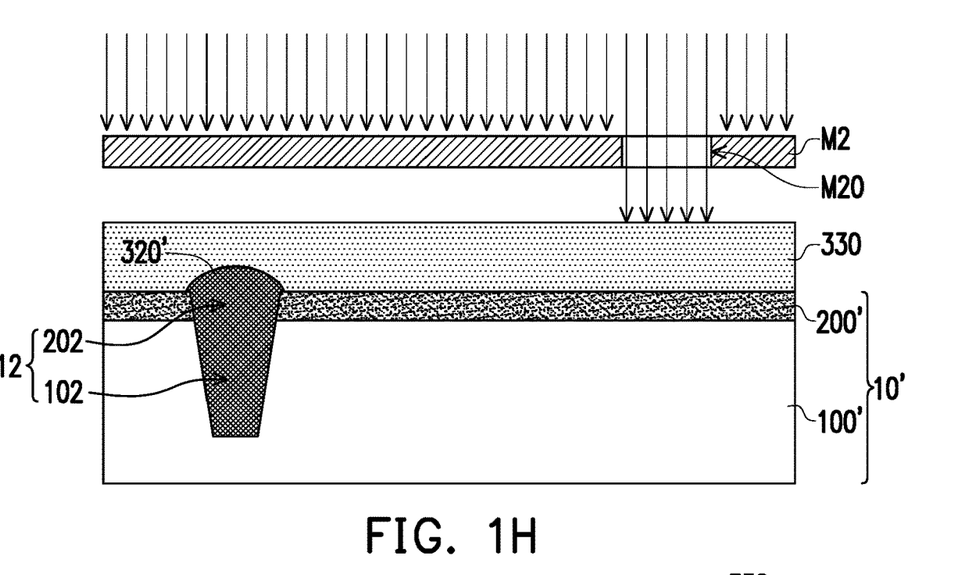
Figure 1I:
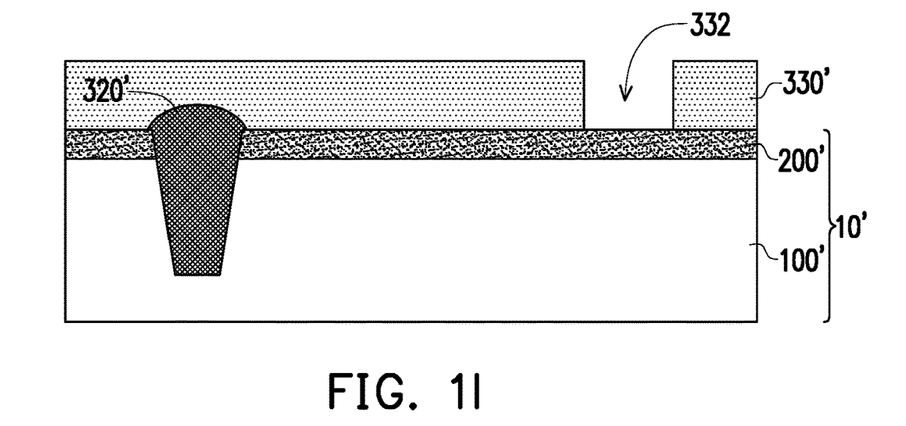

Referring to FIGS. 1H and 1I, a third photoresist material 330 is formed on the first patterned underlying structure 10' and the second patterned photoresist layer 320'. In this embodiment, the third photoresist material 330 is directly in contact with the first patterned underlying structure 10' and the second patterned photoresist layer 320'. The third photoresist material 330 is directly formed on the first patterned hard mask layer 200' and the second patterned photoresist layer 320'. A method of forming the third photoresist material 330 includes spin coating or other suitable processes.

In this embodiment, since the second patterned photoresist layer 320' fills the first opening 12, influence of the first opening 12 on the third photoresist material 330 may be reduced, thereby improving the yield of a subsequent photolithography process.

Next, the third photoresist material 330 is patterned using a second photomask M2 as a mask to form a third patterned photoresist layer 330' including a through hole 332. In this embodiment, the third photoresist material 330 is a positive photoresist, and a part where the third photoresist material 330 is exposed by an opening M20 of the second photomask M2 is removed by a developer during a developing process, but the disclosure is not limited thereto. In other embodiments, the third photoresist material 330 is a negative photoresist.

Figure 1J:
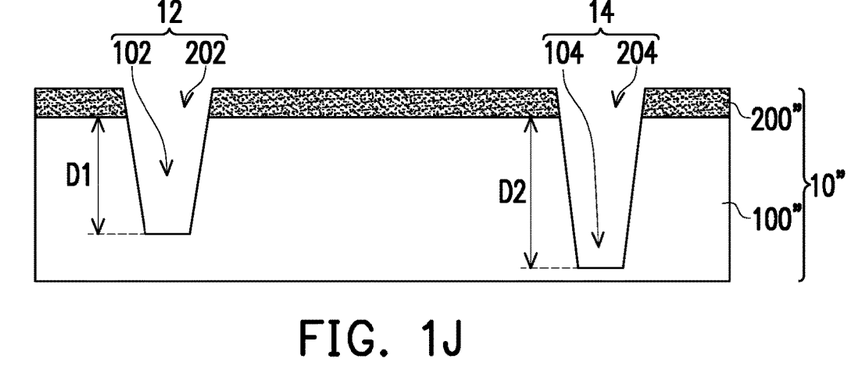

Finally, referring to FIGS. 1I and 1J, a second patterning process is performed on the first patterned underlying structure 10' to form a second patterned underlying structure 10" including the first opening 12 and a second opening 14. A depth D1 of the first opening 12 is different from a depth D2 of the second opening 14. In this embodiment, the depth D1 of the first opening 12 is smaller than the depth D2 of the second opening 14. In other embodiments, the depth D1 of the first opening 12 is greater than the depth D2 of the second opening 14. The second patterning process includes etching the first patterned underlying structure 10' using the third patterned photoresist layer 330' as a mask.

In this embodiment, a second patterned underlying structure 20' includes a second patterned hard mask layer 200" and a second patterned semiconductor structure 100", and the first opening 12 and the second opening 14 extend from the second patterned hard mask layer 200" into the second patterned semiconductor structure 100". For example, the second patterning process includes the following steps. The first patterned hard mask layer 200' is etched using the third patterned photoresist layer 330' as a mask to form the second patterned hard mask layer 200" including the opening 202 and an opening 204. Next, the first patterned semiconductor structure 100' is etched using the second patterned hard mask layer 200" as a mask to form the second patterned semiconductor structure 100" including the opening 102 and an opening 104. The second opening 14 is composed of the opening 204 and the opening 104.

In some embodiments, the second patterned photoresist layer 320' and the third patterned photoresist layer 330' are removed while the first patterned underlying structure 10' is etched (e.g., while the first patterned hard mask layer 200' is etched or the first patterned semiconductor structure 100' is etched), but the disclosure is not limited thereto. In other embodiments, an additional removal process is provided to remove the unnecessary second patterned photoresist layer 320' and third patterned photoresist layer 330'. The removal process includes, for example, an ashing process or other suitable process.

FIGS. 2A to 2D are schematic cross-sectional views of a method of patterning an underlying structure according to an embodiment of the disclosure. It should be noted here that the embodiments of FIGS. 2A to 2D use the reference numerals and part of the content of the embodiments of FIGS. 1A to 1J. The same or similar reference numerals are used to represent the same or similar elements, and the description of the same technical content is omitted. For the description of the omitted part, please refer to the foregoing embodiments, and the repeated description will be omitted here.

Figure 2A:
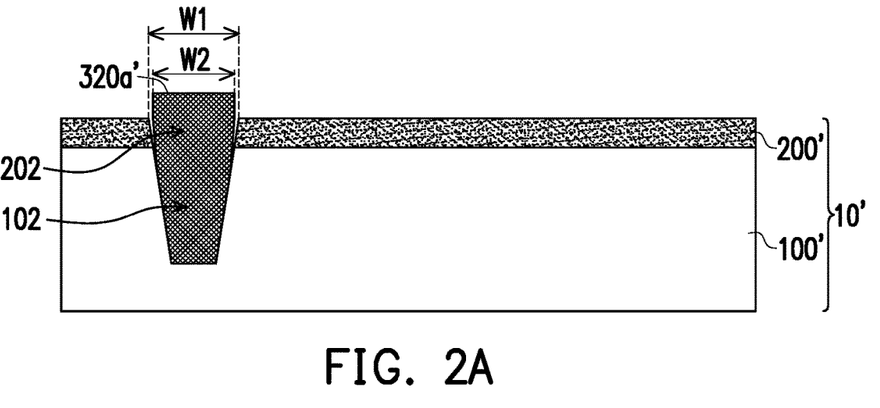
FIGS. 2A to 2D are schematic cross-sectional views of a method of patterning an underlying structure according to an embodiment of the disclosure.

FIG. 2A follows the step of FIG. 1F. Referring to FIGS. 1F and 2A, the second photoresist material 320 is patterned using the first photomask M1 as a mask to form a second patterned photoresist layer 320a'. The second patterned photoresist layer 320a' fills the first opening 12. In this embodiment, the second photoresist material 320 is a negative photoresist. A part where the second photoresist material 320 is shielded by the first photomask M1 is removed by a developer during a developing process.

In some embodiments, a top surface of a second photoresist material 320a' extends beyond the first opening 12. In some embodiments, the second photoresist material 320a' partially fills the first opening 12. For example, a width W2 of the second photoresist material 320a' is smaller than the width W1 of the first opening 12.

In this embodiment, since the first photoresist material 310 (referring to FIG. 1B) and the second photoresist material 320 are patterned using the same first photomask M1, the cost required for a photolithography process may be saved.

Figure 2B:
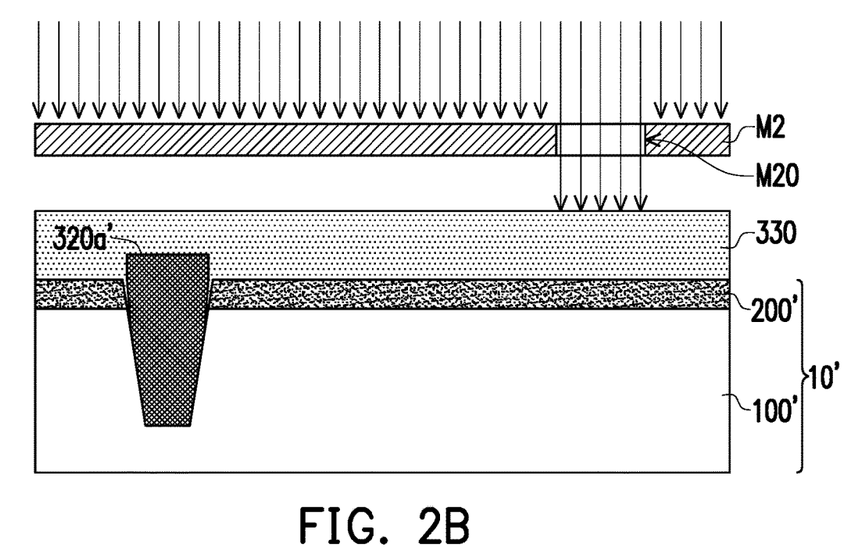
Figure 2C:
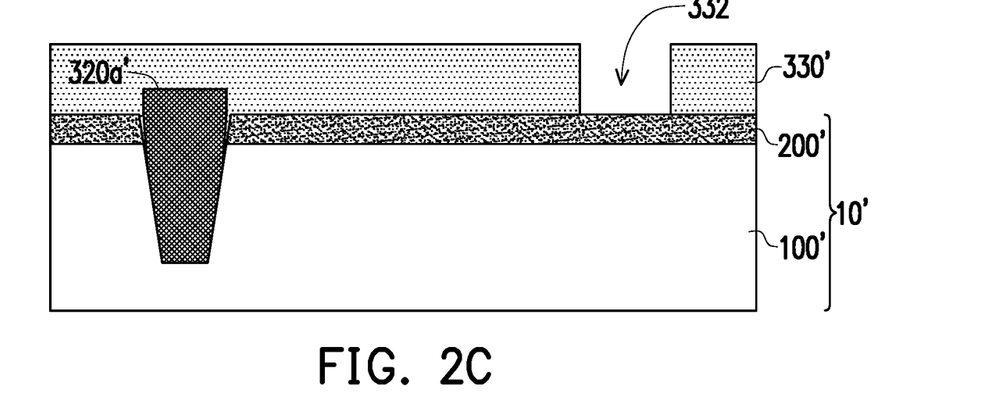

Referring to FIGS. 2B and 2C, the third photoresist material 330 is formed on the first patterned underlying structure 10' and the second patterned photoresist layer 320a'. In this embodiment, the third photoresist material 330 is directly formed on the first patterned hard mask layer 200' and the second patterned photoresist layer 320a'. In addition, in this embodiment, part of the third photoresist material 330 fills a gap between the second patterned photoresist layer 320a' and a sidewall of the first opening 12.

In this embodiment, since the second patterned photoresist layer 320a' fills the first opening 12, influence of the first opening 12 on the third photoresist material 330 may be reduced, thereby improving the yield of a subsequent photolithography process.

Next, the third photoresist material 330 is patterned using the second photomask M2 as a mask to form the third patterned photoresist layer 330' including the through hole 332. In this embodiment, the third photoresist material 330 is a positive photoresist, and a part where the third photoresist material 330 is exposed by the opening M20 of the second photomask M2 is removed by a developer during a developing process, but the disclosure is not limited thereto. In other embodiments, the third photoresist material 330 is a negative photoresist.

Figure 2D:
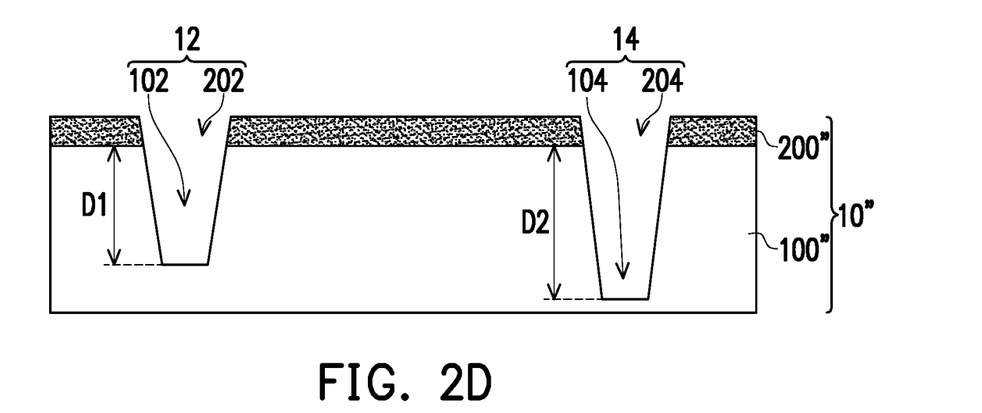

Finally, referring to FIGS. 2C and 2D, the second patterning process is performed on the first patterned underlying structure 10' to form the second patterned underlying structure 10'' including the first opening 12 and the second opening 14. The second patterning process includes etching the first patterned underlying structure 10' using the third patterned photoresist layer 330' as a mask.

FIGS. 3A to 3F are schematic cross-sectional views of a method of patterning an underlying structure according to an embodiment of the disclosure. It should be noted here that the embodiments of FIGS. 3A to 3F use the reference numerals and part of the content of the embodiments of FIGS. 1A to 1J. The same or similar reference numerals are used to represent the same or similar elements, and the description of the same technical content is omitted. For the description of the omitted part, please refer to the foregoing embodiments, and the repeated description will be omitted here.

Figure 3A:
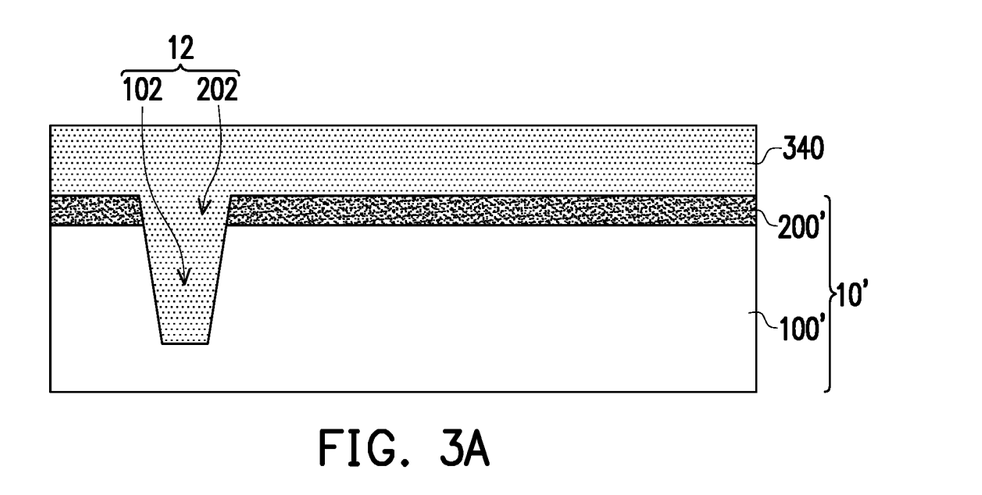
FIGS. 3A to 3F are schematic cross-sectional views of a method of patterning an underlying structure according to an embodiment of the disclosure.

FIG. 3A follows the step of FIG. 1D. Referring to FIG. 3A, a second photoresist material 340 is formed on the first patterned underlying structure 10', and the second photoresist material 340 fills the first opening 12. In this embodiment, the second photoresist material 340 is directly formed on the first patterned hard mask layer 200' and the first patterned semiconductor structure 100'. A method of forming the second photoresist material 340 includes spin coating or other suitable processes. In this embodiment, the first photoresist material 310 (referring to FIG. 1A) and the second photoresist material 340 are both positive photoresist materials.

Figure 3B:
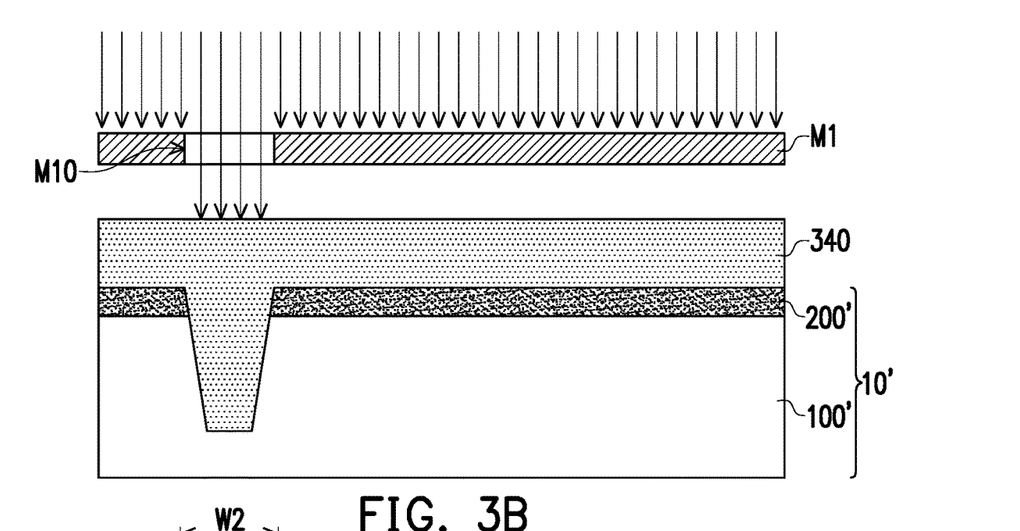
Figure 3C:
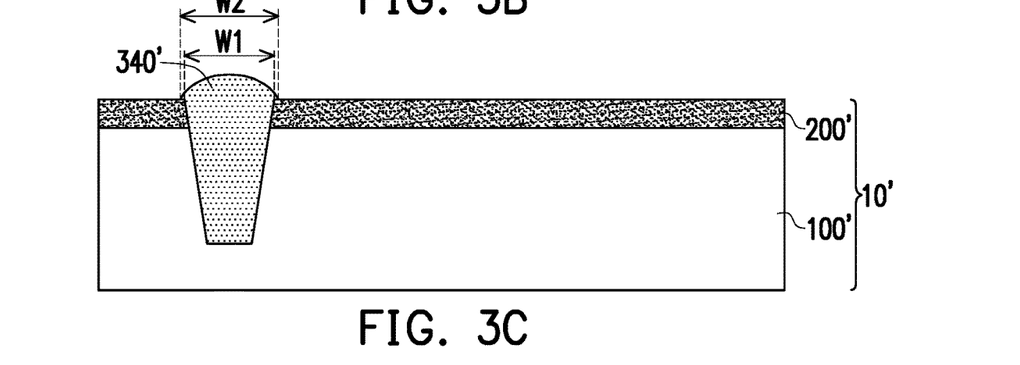

Referring to FIGS. 3A and 3B, the second photoresist material 340 is patterned using the first photomask M1 as a mask to form a second patterned photoresist layer 340'. The second patterned photoresist layer 340' fills the first opening 12. In this embodiment, since the first photoresist material 310 (referring to FIG. 1A) and the second photoresist material 340 are both positive photoresist materials, in order to perform a patterning process on the first photoresist material 310 and the second photoresist material 340 using the same first photomask M1, a developing process of the second photoresist material 340 needs to use a negative developer. Specifically, patterning the second photoresist material 340 includes the following steps. The second photoresist material 340 is exposed using the first photomask M1 as a mask. A developing process is performed on the exposed second photoresist material 340 using a negative developer. In the aforementioned case, a part where the second photoresist material 340 is shielded by the first photomask M1 is removed by the developer during the developing process.

In some embodiments, a top surface of the second patterned photoresist layer 340' extends beyond the first opening 12. In some embodiments, the second patterned photoresist layer 340' completely fills the first opening 12. In some embodiments, a width W2 of the second patterned photoresist layer 340' is different from the width W1 of the first opening 12. For example, the width W2 is greater than the width W1.

In this embodiment, since the first photoresist material 310 (referring to FIG. 1B) and the second photoresist material 320 are patterned using the same first photomask M1, the cost required for a photolithography process may be saved.

Figure 3D:
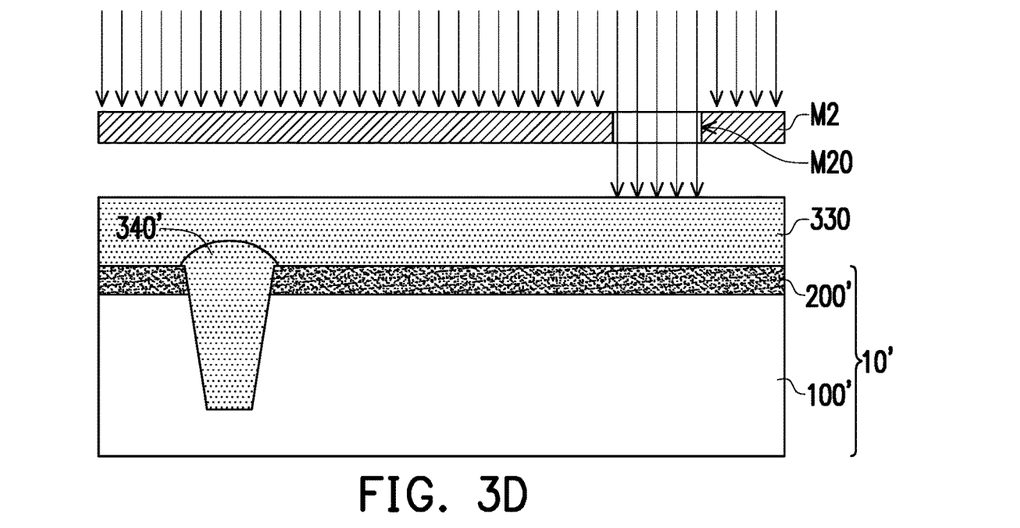

Referring to FIG. 3D, the third photoresist material 330 is formed on the first patterned underlying structure 10' and the second patterned photoresist layer 340'. In this embodiment, the third photoresist material 330 is directly in contact with the first patterned underlying structure 10' and the second patterned photoresist layer 340'. The third photoresist material 330 is directly formed on the first patterned hard mask layer 200' and the second patterned photoresist layer 340'.

In this embodiment, since the second patterned photoresist layer 340' fills the first opening 12, influence of the first opening 12 on the third photoresist material 330 may be reduced, thereby improving the yield of a subsequent photolithography process.

Figure 3E:
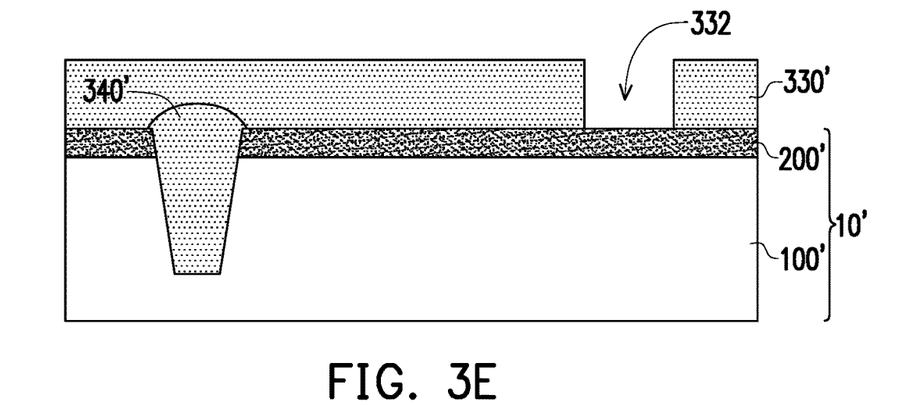

Referring to FIGS. 3D and 3E, the third photoresist material 330 is patterned using the second photomask M2 as a mask to form the third patterned photoresist layer 330' including the through hole 332. In this embodiment, the third photoresist material 330 is a positive photoresist, and a part where the third photoresist material 330 is exposed by the opening M20 of the second photomask M2 is removed by a developer during a developing process, but the disclosure is not limited thereto. In other embodiments, the third photoresist material 330 is a negative photoresist.

Figure 3F:
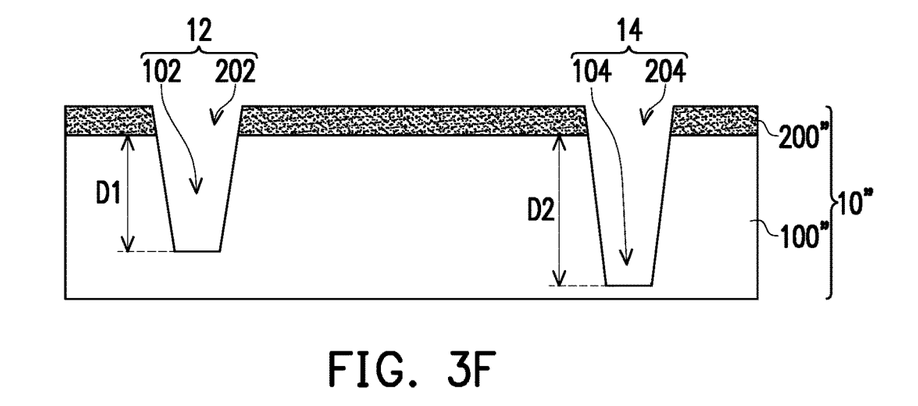

Finally, referring to FIGS. 3E and 3F, the second patterning process is performed on the first patterned underlying structure 10' to form the second patterned underlying structure 10" including the first opening 12 and the second opening 14. The depth D1 of the first opening 12 is different from the depth D2 of the second opening 14. In this embodiment, the depth D1 of the first opening 12 is smaller than the depth D2 of the second opening 14. In other embodiments, the depth D1 of the first opening 12 is greater than the depth D2 of the second opening 14. The second patterning process includes etching the first patterned underlying structure 10' using the third patterned photoresist layer 330' as a mask.

Figure 4:
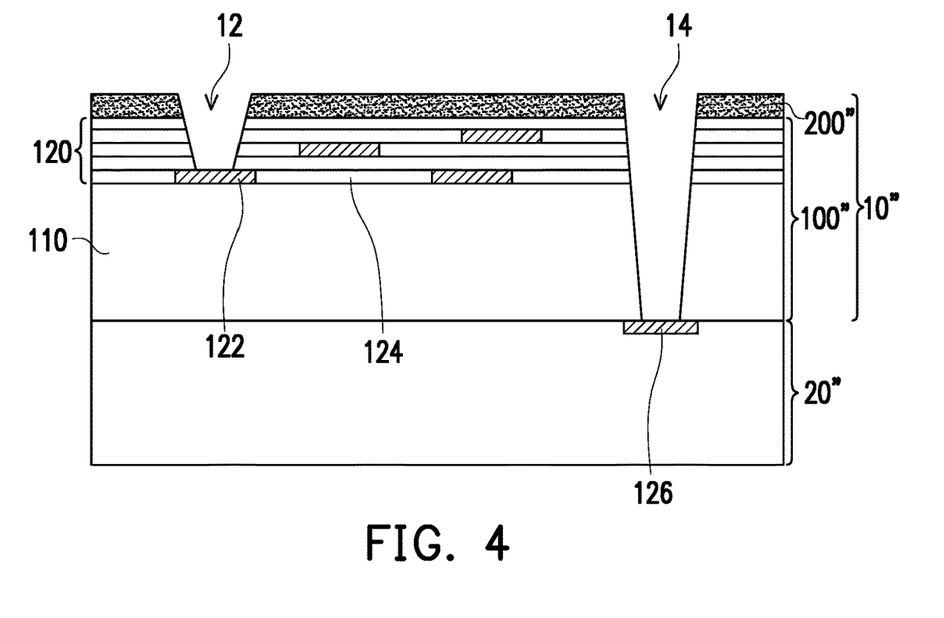
FIG. 4 is a schematic cross-sectional view of a second patterned underlying structure according to an embodiment of the disclosure.

FIG. 4 is a schematic cross-sectional view of a second patterned underlying structure 10" according to an embodiment of the disclosure. In this embodiment, the second patterned underlying structure 10" is patterned by, for example, the method disclosed in any of the foregoing embodiments, and the second patterned underlying structure 10" is disposed on an other underlying structure 20". The other underlying structure 20" includes a conductive layer 126 located on a surface of the other underlying structure 20". In some embodiments, the other underlying structure 20" further includes a semiconductor structure, an insulating layer, or other suitable components.

Referring to FIG. 4, in this embodiment, the second patterned underlying structure 10" includes the second patterned hard mask layer 200" and the second patterned semiconductor structure 100". The second patterned semiconductor structure 100" includes, for example, a semiconductor substrate 110 and a redistribution structure 120. A material of the semiconductor substrate 110 is, for example, a silicon substrate, a silicon carbide substrate, a gallium nitride substrate or other suitable semiconductor materials. The redistribution structure 120 includes at least a conductive layer 122 and at least an insulating layer 124 stacked.

In this embodiment, the first opening 12 of the second patterned underlying structure 10" is located in the redistribution structure 120 and exposes part of the conductive layer 122. The first opening 12 does not extend into the semiconductor substrate 110. The second opening 14 of the second patterned underlying structure 10" extends through the redistribution structure 120 and the semiconductor substrate 110. The second opening 14 is, for example, a through silicon via (TSV), and the second opening 14 exposes part of the conductive layer 126 of the other underlying structure 20".

What is claimed is:

1. A method of patterning an underlying structure, comprising:
    providing the underlying structure;
    forming a first photoresist material on the underlying structure;
    patterning the first photoresist material using a first photomask as a mask to form a first patterned photoresist layer;
    performing a first patterning process on the underlying structure to form a first patterned underlying structure comprising a first opening, wherein the first patterning process comprises:
        etching the underlying structure using the first patterned photoresist layer as a mask;
    forming a second photoresist material on the first patterned underlying structure, wherein the second photoresist material fills the first opening;
    patterning the second photoresist material using the first photomask as a mask to form a second patterned photoresist layer, wherein the second patterned photoresist layer fills the first opening;
    forming a third photoresist material on the first patterned underlying structure and the second patterned photoresist layer;
    patterning the third photoresist material using a second photomask as a mask to form a third patterned photoresist layer; and
    performing a second patterning process on the first patterned underlying structure to form a second patterned underlying structure comprising the first opening and a second opening, wherein the second patterning process comprises:
        etching the first patterned underlying structure using the third patterned photoresist layer as a mask.

2. The method of patterning the underlying structure according to claim 1, wherein one of the first photoresist material and the second photoresist material is a positive photoresist material, and the other is a negative photoresist material.

3. The method of patterning the underlying structure according to claim 1, wherein the first photoresist material and the second photoresist material are both positive photoresist materials, and patterning the second photoresist material comprises:
    exposing the second photoresist material using the first photomask as a mask; and
    performing a developing process on the second photoresist material exposed using a negative developer.

4. The method of patterning the underlying structure according to claim 1, wherein a top surface of the second patterned photoresist layer extends beyond the first opening.

5. The method of patterning the underlying structure according to claim 1, wherein the second patterned photoresist layer completely fills the first opening.

6. The method of patterning the underlying structure according to claim 1, wherein a width of the second patterned photoresist layer is different from a width of the first opening.

7. The method of patterning the underlying structure according to claim 1, wherein a depth of the first opening is different from a depth of the second opening.

8. The method of patterning the underlying structure according to claim 1, wherein the third photoresist material is directly in contact with the first patterned underlying structure and the second patterned photoresist layer.

9. The method of patterning the underlying structure according to claim 1, wherein the underlying structure comprises:
   a semiconductor structure; and
   a hard mask layer located on the semiconductor structure, wherein the first photoresist material is directly formed on the hard mask layer.

10. The method of patterning the underlying structure according to claim 1, wherein the first patterning process comprises:
   etching the hard mask layer using the first patterned photoresist layer as a mask to form a first patterned hard mask layer; and
   etching the semiconductor structure using the first patterned hard mask layer as a mask to form a first patterned semiconductor structure, wherein the first patterned underlying structure comprises the first patterned hard mask layer and the first patterned semiconductor structure, and the first opening extends from the first patterned hard mask layer into the first patterned semiconductor structure.

11. The method of patterning the underlying structure according to claim 10, further comprising:
   removing the first patterned photoresist layer.

12. The method of patterning the underlying structure according to claim 10, wherein the second patterning process comprises:
   etching the first patterned hard mask layer using the third patterned photoresist layer as a mask to form a second patterned hard mask layer; and
   etching the first patterned semiconductor structure using the second patterned hard mask layer as a mask to form a second patterned semiconductor structure, wherein the second patterned underlying structure comprises the second patterned hard mask layer and the second patterned semiconductor structure, and the first opening and the second opening extend from the second patterned hard mask layer into the second patterned semiconductor structure.

13. The method of patterning the underlying structure according to claim 12, further comprising:
   removing the second patterned photoresist layer and the third patterned photoresist layer.

* * * * *